Oct. 1, 1957 R. P. CROW ET AL 2,808,469

TRANSISTOR CIRCUIT

Filed April 20, 1953

INVENTORS
Robert P. Crow
John A. Doremus
BY
Norman L. Mueller
Atty.

2,808,469
Patented Oct. 1, 1957

2,808,469

TRANSISTOR CIRCUIT

Robert P. Crow, Park Ridge, and John A. Doremus, Chicago, Ill., assignors to Motorola, Inc., Chicago, Ill., a corporation of Illinois Application April 20, 1953, Serial No. 349,666

1 Claim. (Cl. 179—171)

This invention relates to transistor circuits, and more particularly to a circuit for linearizing the transistor characteristic for large signal values.

Transistors have been used in many applications in electronic circuits to replace vacuum tubes and have the advantage of greater ruggedness and longer life. However, the transistor characteristic is such that for large signal values the output current of the device does not vary linearly with the input voltage. This is because the transistor output current is substantially linear with the input current, but the input current and input voltage do not have a linear relation as the input resistance rises at low currents. This results in distortion at low current values and particularly in push-pull circuits wherein class B operation is obtained and signals having current values all the way to zero are utilized. This has made it impossible to use transistors in many applications wherein it would be otherwise desirable to use the same.

It is, therefore, an object of the present invention to provide an improved transistor circuit.

A further object of this invention is to provide a circuit which effectively linearizes the input voltage output current characteristic curve of a transistor so that it may be used as a class B stage and may be used in push-pull circuits.

A feature of this invention is the provision of a transistor stage wherein the input circuit has a high impedance so that the input current is substantially independent of the voltage drop across the input electrodes of the transistor, and the input current is therefore substantially linear with the input voltage. This permits class B and push-pull operation of the transistor stage with good results.

A further feature of this invention is the provision of a push-pull transistor amplifier circuit wherein separate input transformers provide high impedance driving sources for the two transistor circuit portions of a push-pull stage. A single input transformer may be used if the magnetic circuit is such that the two secondary windings which drive the transistor of the push-pull circuit are substantially isolated from each other.

Further objects, features and the attending advantages of the invention will be apparent from a consideration of the following description when taken in conjunction with the accompanying drawings in which.

In practicing the invention a push-pull transistor circuit is provided including a pair of transistors connected in a balanced circuit. High impedance input circuits are provided for the transistors which may include transformers which are isolated from each other. These transformers may be fed by a transistor stage or other driving means having high impedance, with this high impedance being reflected through the transformers to the inputs of the transistors. The input transformers may be entirely separate transformer structures, or separate from each other magnetically and potted in a single housing, or may have a single core which is so designed that the two transformer portions are substantially isolated from each other. This minimizes the loading of one input circuit by the other. These arrangements provide a high input impedance for the transistor so that the resistance of the input path through the transistor is a small part of the input impedance and therefore the input current is substantially linear with the input voltage. This linear relationship exists even for high signal levels which provide wide swings going down to small current values. This results in the output current being linear with the input voltage, which permits the units to be used in class B circuits such as push-pull circuits.

Figure 1:
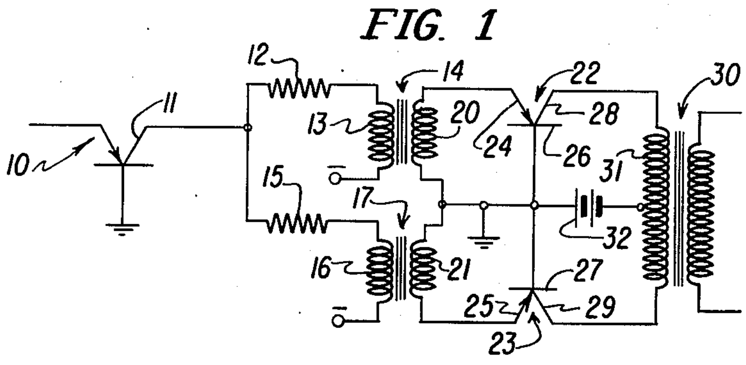
Fig. 1 is a circuit diagram illustrating the circuit in accordance with the invention.

Referring now to the drawings, in Fig. 1 there is illustrated a push-pull transistor amplifier circuit including a driver stage 10. This is illustrated as a grounded base transistor circuit but may be of other types. The collector electrode 11 of the transistor 10 is connected to two parallel circuits, the first including resistor 12 and primary winding 13 of transformer 14. This circuit is connected to a minus potential as required for a PNP type transistor. The second path includes resistor 15 and the winding 16 of transformer 17. This path is also connected to the minus potential source. The same circuit could be used with NPN type transistors by merely providing a positive potential source.

The transformer 14 and 17 include secondary windings 20 and 21 respectively which feed the transistors 22 and 23 respectively. The winding 20 is connected to the emitter electrode 24 of transistor 22, and the winding 21 is connected to the emitter electrode 25 of the transistor 23. The transistor stages 22 and 23 are also illustrated as of the grounded base type but other types of circuits may be used if desired. The collector electrodes 28 and 29 are connected to the primary winding 31 of the push-pull output transformer 30. The center tap on the winding 31 is connected to a negative potential source which is illustrated as a battery 32. It is to be pointed out that any other potential source may be used, and as stated above the polarity of the source depends upon the type of transistor used with a negative potential being required for PNP type transistors and a positive potential being required for NPN type transistors.

Figure 2:
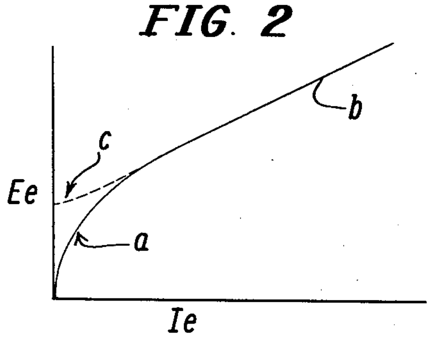
Fig. 2 shows the characteristic curve of a transistor amplifier.

Considering the operation of this circuit, reference is made to Fig. 2. In this figure the emitter voltage of the transistors 22 or 23 is shown as the ordinate axis and the emitter current is shown as the abscissa axis. As the collector current varies substantially linearly with the emitter current, the abscissa also approximates the collector current, but the scales of the emitter current and the collector current will be different. It will be noted from Fig. 2 that for small current values the relation between the emitter voltage and the emitter current is not linear. This is indicated by the part *a* of the curve. For larger values the curve is substantially linear as indicated by the part *b* of the curve. It is desired to modify the response so that for small values the curve will follow the dotted line marked *c*. The dropping off of the characteristic at low current levels is caused by the rise in resistance of the emitter-base circuit for low currents.

In accordance with the invention the non-linear input characteristic of the transistor for low current values is compensated for by the use of a relatively high impedance input circuit so that the resistance of the input circuit of the transistor is a small part of the entire resistance of the input circuit to the transistor. In push-pull systems the input circuits for the two portions of the system must be isolated so that each does not load the other. Therefore, the input current is substantially linear with the input voltage so that the characteristic in effect, is straightened out and follows the line *c* as shown in Fig. 2. This permits the operation of the transistor amplifier as class B stages, and also makes it possible to use the stages in a push-pull circuit having almost zero idling current with the characteristics being linear so that the output has high fidelity.

Figure 3:
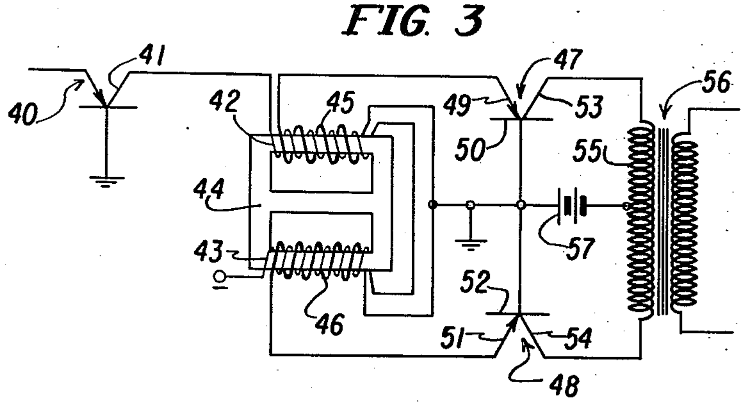
Fig. 3 illustrates a second embodiment of the invention.

In Fig. 3 there is illustrated a second embodiment of the invention which may be preferred in that the transformer structure required is somewhat simplified. The input stage 40 again may be a transistor or any other driving stage having a high output impedance. The collector 41 of the transistor in the driver stage is connected to windings 42 and 43 which are connected in series and wound on opposite legs of a divided magnetic core structure 44. The winding 43 is connected to a minus potential to provide the required bias for a PNP type transistor.

On the same portions of the magnetic structure 44 as the windings 42 and 43 there are provided secondary windings 45 and 46 respectively. These windings are effectively connected in series with the center terminal thereof connected to ground and the outside terminals connected to the transistor stages 47 and 48. The winding 45 is connected to the emitter electrode 49 of the transistor 47 and the base electrode thereof is connected to ground. The winding 46 is connected to emitter electrode 51 of transistor 48 and the base electrode 52 of this transistor is also connected to ground. Therefore windings 45 and 46 provide push-pull input circuits to the transistors 47 and 48. The collector electrodes 53 and 54 of the transistors 47 and 48 are connected to the primary winding 55 of a push-pull output transformer 56. A negative potential may be supplied to a center tap on the winding 55 by the source 57 which is illustrated as a battery.

The circuit of Fig. 3 operates in the same manner as the circuit of Fig. 1. The magnetic structure 44 is arranged so that the coupling of the windings 42 and 45 with respect to the windings 43 and 46 is held to a minimum so that one stage does not load the other, and high input impedances are provided for both stages under all conditions. This results in the desired linearizing effect which has been fully described with respect to Fig. 1.

It is seen from the above that there is provided an improved transistor circuit wherein linear operation is provided even for large signal values. This permits the operation of the transistor stages as class B amplifiers and permits the use of push-pull circuits with almost zero idling current, while still providing non-distorted high fidelity operation.

The transistors used in the circuits in accordance with the invention are not limited to a particular type and the connection thereof is also not limited. That is the individual transistors may be of the point contact or junction types with either PNP or NPN formations, and the circuit connections may be of some other type, such as the grounded emitter type, as well as the grounded base type as illustrated.

Although certain embodiments of the invention have been described which are illustrative thereof, it is obvious that various changes and modifications can be made therein with the intended scope of the invention as defined in the appended claim.

We claim:

An amplifier circuit of the push-pull type including in combination, first and second transistor devices each having base, emitter and collector electrodes, each of said transistor devices exhibiting relatively low impedance between said emitter and base electrodes and exhibiting relatively high impedance between said collector and base electrodes, with said relatively low impedance being subject to vary for low current flow between said emitter and base electrodes, means for connecting said base electrode of each of said transistor devices to a point of reference potential, an input circuit including first and second transformers each having a primary winding and a secondary winding, a relatively high impedance single ended signal source, a first resistor connected in series with said primary winding of said first transformer to said signal source, a second resistor connected in series with said primary winding of said second transformer to said signal source, a first input circuit portion connecting said secondary winding of said first transformer between said emitter electrode of said first transistor device and said point of reference potential, and a second input circuit portion connecting said secondary winding of said second transformer between said emitter electrode of said second transistor device and said point of reference potential, said first and second transformers reflecting the impedance of said source to said first and second input circuit portions so that said input circuit portions have relatively high impedance as compared with said impedance between said emitter and base electrodes of said transistor devices, said first and second input circuit portions being completely independent of each other except for the common connection thereof to said point of reference potential.

References Cited in the file of this patent

UNITED STATES PATENTS

| | | |
|---|---|---|
| 2,647,957 | Mallinckrodt | Aug. 4, 1953 |
| 2,652,460 | Wallace | Sept. 15, 1953 |